Figure 1:
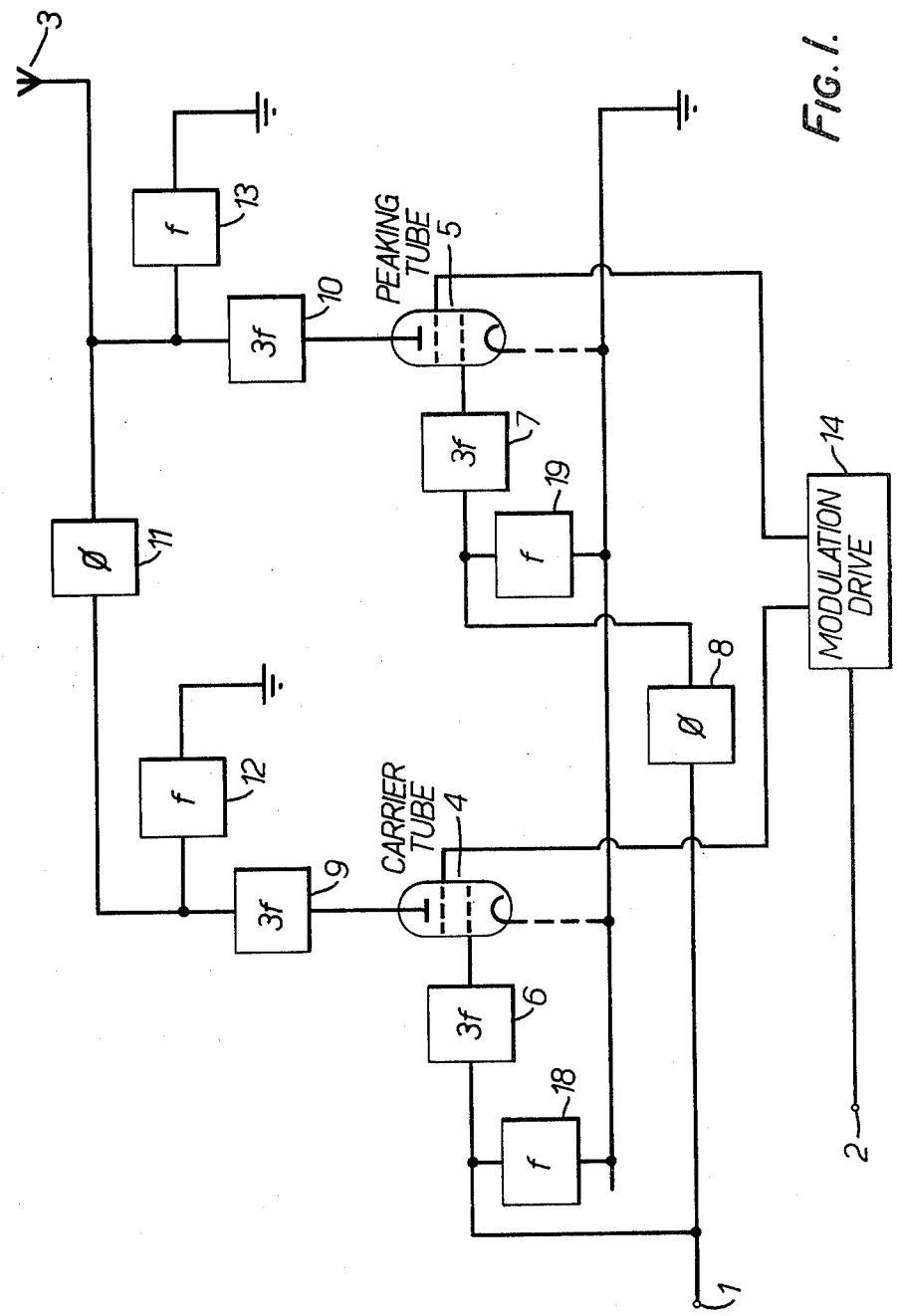

United States Patent [19]

Bowers

[11] 4,335,363

[45] Jun. 15, 1982

[54] AMPLITUDE MODULATOR USING A CARRIER TUBE AND A PEAKING TUBE

[75] Inventor: Douglas F. Bowers, Chelmsford, England

[73] Assignee: The Marconi Company Limited, Chelmsford, England

[21] Appl. No.: 175,832

[22] Filed: Aug. 5, 1980

[30] Foreign Application Priority Data

Aug. 14, 1979 [GB] United Kingdom ............... 7928255

[51] Int. Cl.³ .............................................. H03C 1/24
[52] U.S. Cl. .............................. 332/37 R; 332/43 R; 332/48; 332/64
[58] Field of Search ............... 332/31 R, 37 R, 43 R, 332/48, 64; 455/108

[56] References Cited

U.S. PATENT DOCUMENTS 2,210,028  8/1940  Doherty .
3,275,950  9/1966  Birr ................................. 332/43 R
3,436,686  4/1969  Vackar .............................. 332/64

FOREIGN PATENT DOCUMENTS 783124   9/1957  United Kingdom .
822209  10/1959  United Kingdom .
829502   3/1960  United Kingdom .
1044479  9/1966  United Kingdom .
1107318  3/1968  United Kingdom .
1500131  2/1978  United Kingdom .

OTHER PUBLICATIONS

Tyler, "A New High-Efficiency High-Power Amplifier", Marconi Review, vol. 21, 1958, pp. 96-109.

Primary Examiner—Siegfried H. Grimm
Attorney, Agent, or Firm—Spencer & Kaye

[57] ABSTRACT

An amplitude modulator in which a radio frequency amplifier is arranged to produce a high power amplitude modulated radio frequency signal in a particularly efficient manner. The amplifier inlcudes two tetrode tubes, one of which is arranged to conduct continuously and the other is arranged to conduct only on the positive going excursions of a modulation signal, which is applied to its screen grid. The harmonic content of a carrier frequency signal which is applied to the control grids of both tetrodes is modified so as to minimize loss in the tetrodes themselves.

9 Claims, 3 Drawing Figures

AMPLITUDE MODULATOR USING A CARRIER TUBE AND A PEAKING TUBE

This invention relates to amplifiers, and is particularly applicable to radio frequency amplifiers in which a requirement exists to convert the electrical power applied to the amplifier to amplitude modulated radio frequency signals in an efficient manner. The electrical power cannot be wholly converted to radio frequency signals since inevitably a proportion of the power is dissipated internally within the amplifier in the form of heat. Additionally the maximum efficiency is dependent on theoretical considerations related to the mode of operation of the amplifier. The present invention seeks to provide a radio frequency amplifier which is able to operate in a particularly efficient manner.

According to this invention a radio frequency amplifier includes first and second electron discharge tubes each having a cathode, a control grid and an anode; means for applying to each control grid a signal comprising the fundamental carrier frequency of a signal to be amplified and harmonics thereof; first filter means connected in the grid-cathode current path of each tube and arranged to present a low impedance to said fundamental frequency whilst presenting a high impedance to a harmonic thereof to attenuate the voltage of said harmonic which is applied to the control grid; second filter means associated with each tube and connected in the anode output current path, and having frequency characteristics similar to said first filter means and being so arranged that substantially only said fundamental frequency appears at output terminals of the amplifier; first phase shift means arranged so that the signals applied to the control grid of said second tube are delayed by a quarter wavelength of the fundamental frequency relative to those signals applied to the control grid of said first tube; second phase shift means arranged to couple together the anode circuits of the first and second tubes such that amplified signals provided by said first tube are in phase at the output terminals with the amplified signals provided by said second tube; and means for applying modulation signals to both first and second tubes so as to amplitude modulate said carrier frequency.

Preferably said first and second tubes are both tetrodes, and said modulation signals are applied to respective screen grids thereof.

Preferably in this case said first filter means are connected to the control grid. The alternative of connecting said first filler means to the cathode of each tube presents difficulties in designing a satisfactory filter which does not adversely affect the operation of the tetrode.

Preferably third filter means arranged to present a low impedance to said harmonic whilst presenting a high impedance to said fundamental frequency are connected in shunt with said output terminals. This ensures that only said fundamental frequency is applied to any load which is connected to the output terminals. The second and third filter means operate together in combination to apply the whole of the fundamental waveform to the load.

Preferably said harmonic is the third harmonic of the fundamental frequency, i.e. the harmonic has a frequency of three times the fundamental frequency.

Preferably only positive-going excursions of said modulation signals are applied to said second tube.

Preferably said means for applying modulation signals to said first tube includes a shunt regulated amplifier.

Preferably said shunt regulated amplifier includes two serially connected amplifying devices, one of which is arranged to receive modulation signals at a control terminal thereof, and the other of which is arranged to receive at a control terminal thereof signals related to the current flowing through said serially connected devices.

Preferably again each amplifying device is a triode or tetrode with the anode of said one device being connected via a resistive impedance to the cathode of said other device, the control electrode of said one device being arranged to receive the modulation signals, and the control electrode of said other device being connected to the anode of said one device with the cathode of said other device being arranged to provide amplified modulation signals to the screen grid of the said first tube.

The use of the first and second tubes and the first and second phase shifting means constitutes a form of amplifier generally referred to as a Doherty amplifier. Amplifiers of this kind were first described in U.S. Pat. No. 2,210,028 published in 1940, and in operation the said first electron discharge tube conducts continuously and is termed the carrier tube, whereas said second electron discharge tube does not conduct for the whole period of each cycle of the modulation signal and is termed the peaking tube.

The use of the filter means ensures that the amplifier operates in what is sometimes referred to as the class D mode. This mode is somewhat similar to class C, but enables the amplifier to operate at higher efficiency. One form of this kind of amplifier is described by V. J. Tyler in an article "A new high-efficiency high-power amplifier", p. 96, Marconi Review, Volume 21, 1958. Although the peaking tube does not conduct continuously, nevertheless the application of this form of class D operation to it is very advantageous since its efficiency can be significantly enhanced in respect of those periods of the modulation waveform whilst it is actually conducting. At high power levels the saving in wasted energy more than offsets any increase in circuit complexity.

Figure 2:
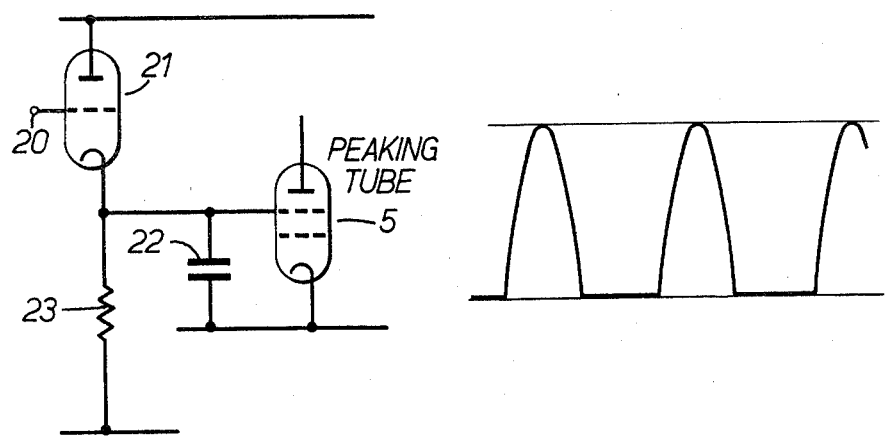
Figure 3:
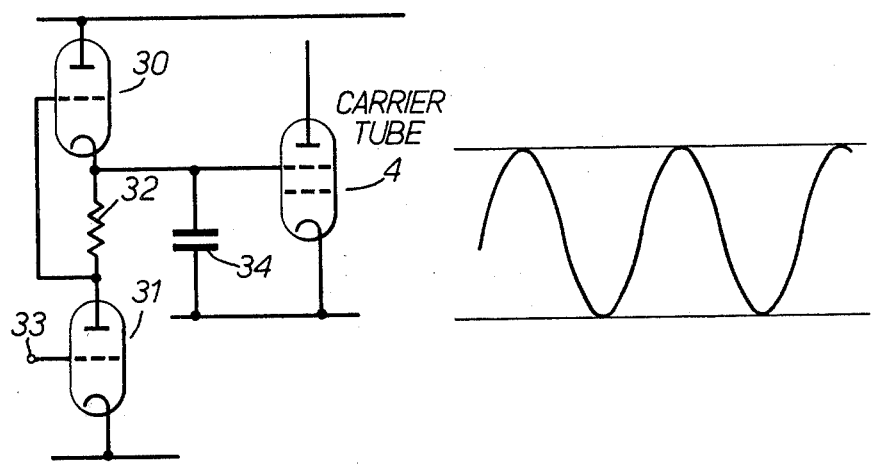

The invention is further described by way of example with reference to the accompanying drawings in which, FIG. 1 shows an amplifier in accordance with the present invention, and FIGS. 2 and 3 illustrate modulation drive circuits for the peaking discharge tube and carrier discharge tube respectively.

Referring to FIG. 1, an amplifier is provided with two input terminals 1 and 2, terminal 1 being arranged to receive a high frequency carrier signal at which amplitude modulated signals are to be broadcast by an antenna 3. The terminal 2 receives modulation signals which carry the information which is to be modulated on to the carrier signal received at terminal 1. The carrier signal is received at a relatively low level and the purpose of the amplifier is to raise the power level of the broadcast signal to a relatively high level, typically many kilowatts of power. The active amplifying elements consist of two electron discharge tubes: these are tetrodes 4 and 5. These two tetrodes are interconnected in a manner which enables the amplifier to operate in a particularly efficient manner. A number of fairly efficient amplifier configurations are already known and the present invention largely resides in a particular advantageous combination of two existing techniques which have been known for many years. The tetrode 4 is arranged to conduct continuously, whilst the carrier frequency signal is applied to it and for this reason it is referred to subsequently as the carrier tube, but the other tetrode 5 conducts only on the positive excursions of the modulation signal and for this reason it is referred to subsequently as the peaking tube.

The carrier tube 4 and the peaking tube 5 receive the carrier signal applied to their respective control electrodes. In both cases the carrier signal is received from terminal 1 via respective filters 6 and 7 each constituted by parallel resonance circuits and which are arranged to present a high impedance to the third harmonic of the fundamental frequency of the carrier signal applied to terminal 1, whilst presenting a low impedance to the fundamental. Further filters 18 and 19 are connected from the inputs of filters 6 and 7 to ground. These are parallel resonance circuits which present a high impedance to the fundamental frequency. By the term the third harmonic is meant a frequency having a value of three times the fundamental frequency. A phase shifting network 8 is positioned between the terminal 1 and the filter 7 and this network is arranged to provide a delay equal to a quarter wavelength of the fundamental frequency. The carrier tube 4 and the peaking tube 5 are both connected via respective filters 9 and 10, which are positioned in their anode circuits, to a common antenna 3. The filters 9 and 10 have transmission characteristics which are the same as filters 6 and 7, and a further phase shifting network 11 is connected between the filter 9 and the antenna 3. The phase shifting network 11 also provides a delay equal to a quarter wavelength of the fundamental frequency. The output of each of filters 9 and 10 are connected via further narrow band filters 12 and 13 to ground. Filters 12 and 13 have the same transmission characteristics as filters 18 and 19. In practice, a matching network (not shown) is provided for the antenna 3, since the output impedance provided by each of the tetrodes is of importance.

The modulation information present at input terminal 2 is fed via a modulation drive circuit 14 to respective screen electrodes of the two tetrodes 4 and 5. The nature of the modulation drive circuit 14, and the nature of the modulation drive waveforms which are fed to the two tetrodes are illustrated in greater detail in FIGS. 2 and 3.

As mentioned previously the presence of the two phase shifting networks 8 and 11, each of which provide a quarter wavelength delay at the fundamental frequency, enables the amplifier to operate along the lines first proposed by Doherty and which was described in U.S. Pat. No. 2,210,028. The Doherty system in effect combines the radio frequency amplifying and modulating functions in the electron discharge tubes which are used as the radio frequency amplifiers. With modulation applied to the screen grids this enables anode circuit efficiencies of very high values to be obtained. Moreover the present invention incorporates a further technique for improving efficiency which was first described by V. J. Tyler in the article in Marconi Review referred to previously. In order to obtain the highest anode conversion efficiency from an electron discharge tube, the anode current must flow during the period when the instantaneous anode to cathode voltage is a minimum. Although the class C mode of operation of an amplifier approaches this requirement, maximum efficiency is not obtained because the anode to cathode voltage is not a minimum at the start and the finish of the current pulse. Tyler proposed an amplifier in which a significant increase in the anode conversion efficiency can be obtained by modifying the waveform presented to the tube for amplification. It is customary to refer to this mode as class D amplification.

The filters 6 and 7 modify the profile of the carrier waveform applied to the tetrode tubes in a manner which permits this greater efficiency to be obtained. Although the power handled by the peaking tube 5 is significantly less than that handled by the carrier tube 4 since it is conductive for only a relatively small fraction of the time, the application of the Tyler high efficiency technique to it results in a significant improvement in efficiency. Its efficiency is enhanced during the period that it is conductive, thereby minimising the energy which would otherwise be wastefully dissipated in the form of heat.

The filters 18 and 19 present high impedances at the fundamental frequency and enable the effective capacitances of the control grids to be minimised, thereby allowing the carrier signal applied to terminal 1 to operate into a high input impedance. The filters 12 and 13 are provided to reconstitute the fundamental frequency at the output of the amplifier. The tetrodes 4 and 5 do not conduct for the whole of each period of the waveform of the carrier signal, but instead produce current pulses during just a portion of each period. The filters 12 and 13 present relatively low impedances to frequencies other than the fundamental, so that only the fundamental frequency is applied to the antenna 3.

The nature of the modulation waveforms which are applied to the screen grids of the peaking tube 5 and the carrier tube 4 are illustrated in FIGS. 2 and 3 respectively. It is sufficient to use a conventional cathode follower circuit in FIG. 2 in which the modulation waveform is applied via terminal 20 to the control grid of a triode 21. The cathode of this triode is connected via a shunt capacitor 22 to the screen electrode of the peaking tube 5. The peaking tube 5 is arranged to conduct only on the positive half cycles of the modulation waveform.

If the circuit shown in FIG. 2 were used as the modulation drive circuit for the carrier tube 4, the product of the capacitance of capacitor 22 and the resistance of the impedance 23 would be so large as to cause distortion of the negative going half cycles of the modulation waveform at high audio frequencies. The value of the resistance cannot be reduced below a certain point without the necessity of using a larger tube 21 than can be economically justified. The expedient of simply making the capacitor 22 smaller is undesirable and consequently the shunt regulated circuit shown in FIG. 3 is adopted. Two triodes 30 and 31 are connected in series with a resistance 32 connected between them as shown. The modulation waveform is applied via input terminal 33 to the control grid of triode 31 and the control grid of triode 30 is connected directly to the anode of triode 31. The output of the modulation drive circuit is taken from the cathode of the triode 30 and applied via a shunt capacitor 34 to the screen grid of the carrier tube 4.

In the drawings, only the active circuits are illustrated and it will be understood that additional circuit components will be required to correctly bias the electron discharge tubes as necessary. Although tubes 30 and 31 are depicted as triodes, tetrodes can be used instead.

I claim:

1. A radio frequency amplifier including first and second electron discharge tubes each having a cathode, a control grid and an anode; means for applying to each control grid a signal comprising the fundamental carrier frequency of a signal to be amplified and harmonics thereof; first filter means connected in the grid-cathode current path of each tube and arranged to present a low impedance to said fundamental frequency whilst presenting a high impedance to a harmonic thereof to attenuate the voltage of said harmonic which is applied to the control grid; second filter means associated with each tube and connected in the anode output current path, and having frequency characteristics similar to said first filter means and being so arranged that substantially only said fundamental frequency appears at output terminals of the amplifier; first phase shift means arranged so that the signals applied to the control grid of said second tube are delayed by a quarter wavelength of the fundamental frequency relative to those signals applied to the control grid of said first tube; second phase shift means arranged to couple together the anode circuits of the first and second tubes such that amplified signals provided by said first tube are in phase at the output terminals with the amplified signals provided by said second tube; and means for applying modulation signals to both first and second tubes so as to modulate said carrier frequency.

2. An amplifier as claimed in claim 1 and wherein said first and second tubes are both tetrodes, and said modulation signals are applied to respective screen grids thereof.

3. An amplifier as claimed in claim 2 and wherein said first filter means are connected to the control grid.

4. An amplifier as claimed in claim 3 and wherein third filter means arranged to present a low impedance to said harmonic whilst presenting a high impedance to said fundamental frequency are connected in shunt with said output terminals.

5. An amplifier as claimed in claim 1 and wherein said harmonic is the third harmonic of the fundamental frequency.

6. An amplifier as claimed in claim 1 and wherein only positive going excursions of said modulation signals are applied to said second tube.

7. An amplifier as claimed in claim 1 and wherein said means for applying modulation signals to said first tube includes a shunt regulated amplifier.

8. An amplifier as claimed in claim 7 and wherein said shunt regulated amplifier includes two serially connected amplifying devices, one of which is arranged to receive modulation signals at a control terminal thereof, and the other of which is arranged to receive at a control terminal thereof signals related to the current flowing through said serially connected devices.

9. An amplifier as claimed in claim 8 and wherein each amplifying device is a triode or tetrode with the anode of said one device being connected via a resistive impedance to the cathode of said other device, the control electrode of said one device being arranged to receive the modulation signals, the control electrode of said other device being connected to the anode of said one device with the cathode of said other device being arranged to provide amplified modulation signals to said first tube.

* * * * *